United States Patent [19]

Means

[11] 3,930,255

[45] Dec. 30, 1975

[54] ANALOG TO DIGITAL CONVERSION BY CHARGE TRANSFER DEVICE

[75] Inventor: Robert W. Means, San Diego, Calif.

[73] Assignee: The United States of America as represented by the Secretary of the Navy, Washington, D.C.

[22] Filed: Feb. 6, 1974

[21] Appl. No.: 440,215

[52] U.S. Cl.............. 340/347 AD; 307/221; 357/24

[51] Int. Cl.$^2$ ........................................... H03K 13/06

[58] Field of Search................... 307/221 D; 357/24; 340/347 AD

[56] References Cited

UNITED STATES PATENTS 2,569,927 10/1951 Gloess et al................. 340/347 AD

OTHER PUBLICATIONS

Altman, "The New Concept—: Charge Coupling," Electronics, 6/21/71, pp. 50–59.

Baertsch, "The Pluses and Minuses of Charge Transport Devices," Electronics, 12/6/71, pp. 86–91.

*Primary Examiner*—Thomas J. Sloyan
*Attorney, Agent, or Firm*—Richard S. Sciascia; Ervin F. Johnston; William T. Skeer

[57] ABSTRACT

An improved analog to digital voltage conversion circuit employs the plurality of spaced electrodes on a semiconductor base to convert an analog voltage into a digital signal output in response to charge transfer between electrode-determined domains within the semiconductor.

1 Claim, 8 Drawing Figures

ANALOG TO DIGITAL CONVERSION BY CHARGE TRANSFER DEVICE

STATEMENT OF GOVERNMENT INTEREST

The invention described herein may be manufactured and used by or for the Government of the United States of America for governmental purposes without the payment of any royalties thereon or therefor.

FIELD OF INVENTION

This invention pertains to the field of solid state electronic circuits. More particularly, this invention pertains to the field of integrated circuitry employing semiconductor materials. In a still greater particularity, this invention pertains to the field of charge-coupled solid state devices or surface charge transfer devices. By way of further characterization, but without limitation thereto, this invention pertains to a solid state charge-coupled analog to digital converter.

DESCRIPTION OF THE PRIOR ART

Other analog to digital convertor systems, A/D convertor, are known in the prior art. Generally, the prior art A/D convertors employ discrete electronic devices in the respective stages. Although the recent advances in semiconductor technology and the associated fabrication techniques have minimized the bulk of such systems they nonetheless require assembly of the individual component parts into a unitary circuit. This discrete assembly is costly and time consuming to manufacture. Additionally, the circuits employing discrete elements are subject to more frequent failures and a relatively high power consumption making them undesireable in remotely positioned and operated oceanographic instrumentation packages and other applications requiring high reliability and low maintenance. Those systems represented in U.S. Pat. No. 3,271,759 to B. Hopper for "Analog to Digital Convertor" and U.S. Pat. No. 3,425,054 to C. I. Cowan for "Analog Digital Convertors" are fairly representative of current practice in the field.

SUMMARY OF THE INVENTION

This invention provides an integrally formed analog to digital convertor using the timed transfer of surface charge domains on a single semiconductor substrata to effect a rapid signal processing capability and high reliability combined with a very low power consumption.

STATEMENT OF THE OBJECTS OF THE INVENTION

The object of this invention is to provide an improved analog to digital convertor.

Another object of this invention is to provide an improved solid state electronic circuit.

Still another object of this invention is to provide an improved solid state electronic circuit for analog to digital conversions.

Still another object of this invention is to provide an analog to digital convertor employing a charge transfer signal processing circuit.

Still another object of the present invention is to provide analog to digital convertor circuit having extremely high reliability.

A further object of this invention is to provide analog to digital convertor capable of rapid signal processing.

Yet another object of this invention is the provision of a solid state analog digital conversion circuit having high reliability combined with very low power comsumption.

Still another object of this invention is the provision of a solid state analog digital convertor using charge transfer signal processing channel and exibiting rapid signal processing, high reliability, and low power consumption.

These and other objects of the invention will become more readily apparent from the ensuing description when taken with the drawings.

DESCRIPTION OF THE PREFERRED EMBODIMENT

Figure 1:
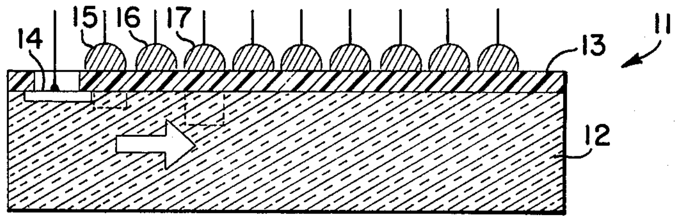
FIG. 1 is a sectional view through a simplified construction of a charge transfer device.

Referring to FIG. 1, a cross-sectional view of a charge transfer device 11 is shown. The semiconductor substrata which may be, for example, silicon has an insulative layer 13 deposited thereon. A semiconductor junction 14 inserts an electrical charge beneath a phase electrode 15. A gate electrode 16 is positioned adjacent of phase electrode 15 to control charge migration within semiconductor 12 as will be presently described.

If electrodes 15 and 17 are maintained at a difference in potential, the charge well located beneath each electrode will reflect this difference in potential. In the illustration, this difference is indicated by the broken line rectangle shown beneath each electrode. If a potential is now applied to gate electrode 16, the charge beneath phase electrode 15 will migrate in the direction of the hollow arrow to the well beneath electrode 16. This migration of charge is termed charge coupled conduction or, in some circles, surface charge transfer. As may be readily appreciated, the virtue of this construction is its extreme simplicity as well as its ability to operate dependably with a very low power drain. Aside from these advantages, however, the devices are capable of being manufactured to an extremely small size such that the bit density is approximately ten times greater than similar shift register devices using field effect transistors.

Figure 2:
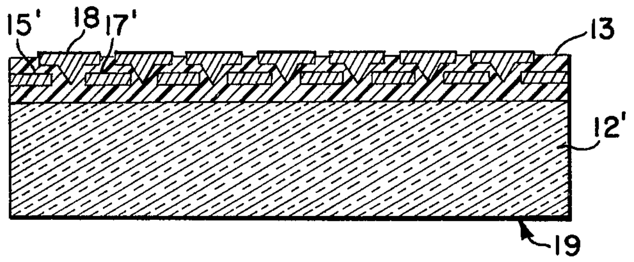
FIG. 2 is a sectional view through a charge transfer semiconductor circuit showing an improved gating electrode.

Referring to FIG. 2, a modified electrode arrangement is illustrated which permits an even greater information density than that shown in FIG. 1. This construction, indicated generally as 19, comprises a semiconductor strata 12', a silicon wafer for example, within an insulation layer 13 deposited thereon. The phase electrodes corresponding to electrodes 15 and 17 of FIG. 1 are indicated at 15' and 17' respectively.

As may be readily seen, the spacing of the phase electrodes is made much closer than the embodiment illustrated in FIG. 1 by the special configuration of gate electrode 18. Gate electrode 18 is constructed to overlap electrodes 15' and 17' and to extend downwardly therebetween. Of course, insulation layer 13 serves to electrically isolate electrodes 15', 17', and 18. This constructional technique permits the individual charge wells located beneath the phase electrodes to be more sharply defined. Also, since electrodes 15' and 17' are much closer together than their FIG. 1 counterparts, the migration of the charges occurs at a much more rapid rate than the arrangement shown in FIG. 1. This transfer continues down the channel, each phase electrode becoming, in turn, a receptor of the charge and a source.

These propaedeutic examples of the charge transfer device technology and the associated descriptions are not to be considered as exhaustive treatments of preferred constructions used in actual assembly, but merely serve to familiarize one with the general operational mode of the device of the invention. If more detail in the theory of operation and constructional details of these state-of-the-art devices is desired, standard works in the electronic construction arts should be consulted. For example, the *Bell System Technical Journal* of April 1970, pages 587 through 600 and *Electronics* magazines, issues of June 21, 1971 and Dec. 6, 1971, pages 50 through 59 and 86 through 91, respectively, are suggested as being particularly helpful and are incorporated by reference herein.

A unique property of a charge coupled device is its ability to divide charges as they are coupled or moved along the surface of the semiconductor by control of the area of the electrodes affecting such movement.

Figure 3:
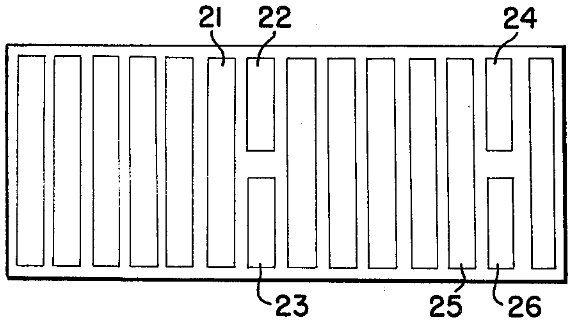
FIG. 3 is a top elevational view of a charge transfer semiconductor showing electrode arrangements which permit signal division.

Referring to FIG. 3, an electrode arrangement to accomplish this signal division is illustrated. For purposes of simplicity, the gate electrodes are not shown in this top elevational view. As may be readily seen, a plurality of electrodes are arranged in a parallel fashion to form a charge transfer channel which extends in a transverse direction to the general length dimensions of the individual electrodes. An electrode 21 is illustrated as extending substantially across the entire width of this channel as determined by the mutual length of other cooperating electrodes. Electrode 21 is followed by two shorter electrodes 22 and 23. Electrodes 22 and 23 are spaced far enough apart, end-wise, to create two distinct potential wells or charge regions each extending only half way across the charge transfer channel. Thus, a charge being transferred from left to right through the charge transfer channel illustrated in FIG. 3 is divided between electrodes 22 and 23 when it is transferred from electrode 21. Of course, a plurality of such signal divisions is possible within each channel and, in FIG. 3, is made by electrodes 24 and 26 which follow electrode 25.

As may be readily visualized by those familiar with a semiconductor fabrication and design technologies, gate electrodes may be placed between adjacent channels such as to transfer charges from one channel to another.

As will be readily appreciated, the charge transfer device lends itself to many general purpose applications. In particular, a device will be described in a present invention as applies to a digital to analog conversion circuit useful in many applications. The instant invention is used in converting the electrical analog data of oceanographic phenomena to digital words which may be more readily transmitted by telemetry linkages. Here, the low power drain, small size, and reliability afforded by the charge transfer device is particularly rewarding.

The implementation of the invention utilizes conventional micro-electronic design techniques and fabrication techniques and therefore, it is believed that such design fundamentals need not be specifically described herein. However, for more purposes of completeness, reference is made to *Micro-Electronic Design* edited by Howard Bierman published by Hayden Book Co. Inc., New York 1966, Library of Congress Catalogue No. 66-18414 as a representative standard work which is hereby incorporated. Similarly, the associated logic circuitry and utilization devices are likewise standard and sufficiently described in such standard works as *Handbook of Pulse-Digital Devices for Communication and Data Processing* by Henry E. Thomas, Prentice-Hall Inc. Engelwood Cliffs, New Jersey 1970, Library of Congress Catalogue Card 72-76878 and, accordingly, need not be described in greater detail herein.

Figure 4:
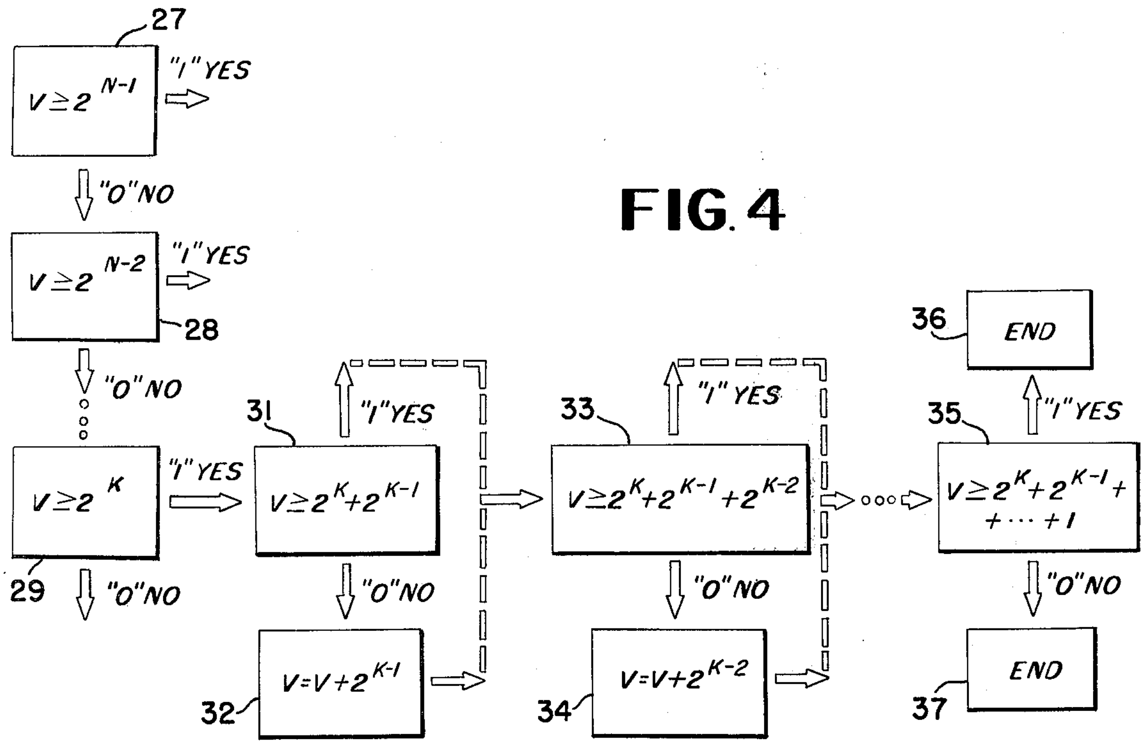
FIG. 4 is a diagramatic showing of an algorithm or analog to digital conversion as used in the invention.

Referring to FIG. 4, a block diagramatic representation of the algorithm used in the analog digital system of the invention is illustrated. As represented by block 27, the first comparison is to whether or not the analog voltage is equal to or greater than $2^{N-1}$ where N is the desired number of digits in the binary word corresponding to the analog voltage V.

In this schematic, a "Yes" answer corresponds to the digital cipher one and a "No" answer to the cipher zero in the final answer. As illustrated, the "Yes" answers correspond to horizontal arrows while the "No" answers correspond to vertical arrows. If the answer is "No," the signal is transferred to the next comparison indicated at block 28 where a determination is made as to whether V is equal to or greater than $2^{N-2}$.

This comparison continues to a value, indicated at block 29, as to whether or not V is equal to or greater than $2^K$. When the answer is obtained as a "Yes", the signal is processed along the horizontal axis as indicated by the "Yes" arrow and the digital figure one in the answer corresponds to this particular transfer. As indicated by block 31, the next comparison as to whether or not V is equal to or greater than $2^K + 2^{K-1}$. A "Yes" answer results in a direct feeding to block 33 while a "No" answer is fed, vertically, to a block 32 where the comparison is made as to whether V is equal to $V + 2^{K-1}$. The indicated digital ciphers one and zero correspond to the answers to these questions, respectively. Block 33 makes the indicated voltage comparison of V as being equal to or greater than $2^K + 2^{K-1} + 2^{K-2}$, and, similarly, a "No" answer is compared with a sum voltage indicated in block 34. This comparison continues in the indicated fashion until a final block 35 makes a comparison with the unknown voltage and the sum of $2^K$ series as indicated and depending upon whether this answer is "Yes" or "No," the digital word is displayed or transferred to the utilization device 36 or 37 as indicated in the schematic diagram.

As will be obvious to those who are versed in the computer programming and digital circuitry arts, this type of a voltage comparison is a rather straightforward process and conventional circuitry implementation thereof is well known and readily recognized by such persons.

Figure 5:
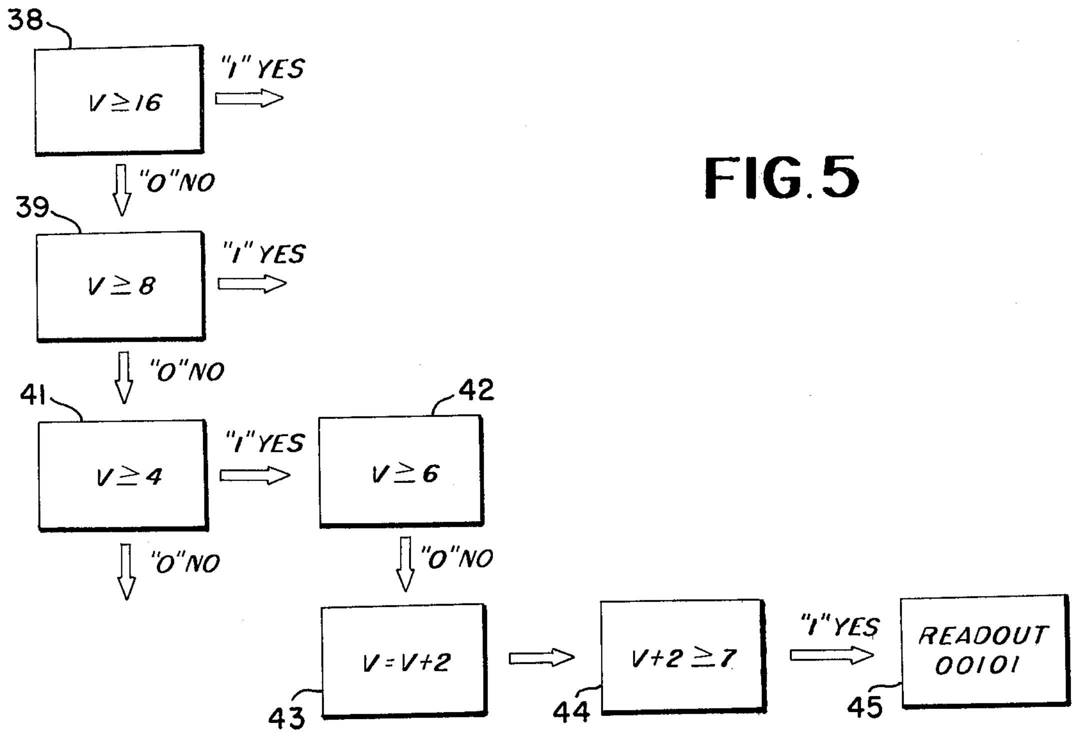
FIG. 5 is a diagramatic showing of the processing of an exemplary analog signal in the fashion demonstrated by FIG. 4.

This process will be better understood with reference to FIG. 5 where an embodiment is illustrated for measuring an analog voltage corresponding to five units to be used in a digital word system having five characters. Thus, block 38 compares whether the unknown voltage, here 5, is greater or equal to 16. The answer is, of course, "No," and the signal is transferred to block 39 and the digit "0" entered as a component of the digital word. Block 39 indicates that the voltage is compared with the reference 8 and again the answer is "No" and another "0" is entered into the digital word and the signal transferred to block 41. At block 41 the voltage is compared as to whether 5 is equal to or greater than 4. Of course, the answer is "Yes" and the digit "1" is placed in the digital word. Next, the signal is transferred to block 42 where, applying the previously discussed algorithm, the voltage is compared with the cipher 6. Here a "No" answer indicates that the voltage was not greater than or equal to 6 and a digit "0" is placed in the answer. The signal is next transferred to block 42 where it is combined with a standard two unit voltage to change the V comparison signal to a V + 2 comparison signal.

This new comparison signal is transferred to block 44 where the signal comparison is made as to whether V + 2 is equal to or greater than 7. Of course, the answer is "Yes" and the final digit "1" is placed in the digital answer and transferred to a read-out 45 where the digital word 00101 is read to correspond to the analog voltage 5.

It will be observed in both phase four and five that there are several possibilities for a "Yes" answer prior to the transfer to the horizontal processing blocks. In order to provide for a complete system, a duplicate series of horizontal blocks may be supplied or, alternatively, a single series of horizontal processing to follow a "Yes" answer may be obtained using a single comparison register which has its values altered to correspond to the point at which the first "Yes" answer is obtained. In these systems, it will be observed that the obtaining of a "No" answer corresponds to a vertical processing of a signal whereas a "Yes" or a one answer corresponds to a horizontal processing of the signal. As will be readily recognized, logic circuitry necessary to program these charge transfers may be easily obtained by suitable standard clocking circuits coupled to the various gate electrodes by standard, well-known logic circuits. This circuit implementation will be more clearly understood when considering the particular cell and logic diagrams to now be described.

Figure 6:
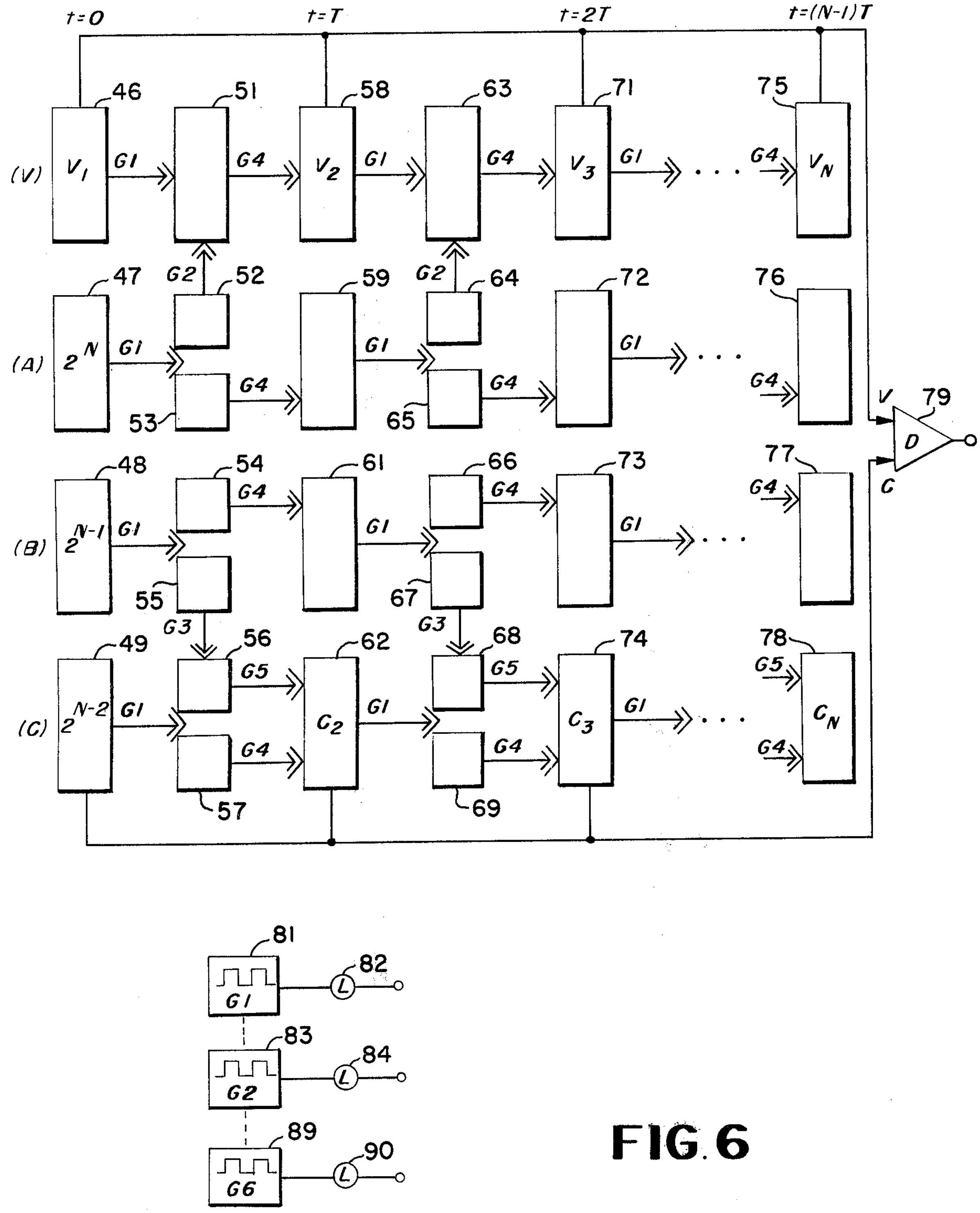
FIG. 6 is a block diagramatic demonstration of a general implementation of the system of the invention.

Referring to FIG. 6, a cell arrangement for accomplishing the aforedescribed signal processing is schematically illustrated. As shown, the cells are arranged in four rows, or channels, indicated as (V), (A), (B), and (C). In this illustration, the phase electrodes are illustrated as rectangular blocks or squares. The gate electrodes are illustrated as double headed arrows to prevent confusion with the standard electronic notation indicating a hard-wired circuit. As shown, row (V) is comprised of only phase electrodes 46, 51, 58, 63, 71, and 75. The physical arrangements of the electrodes to establish the signal processing cells are as shown and discussed with reference to FIGS. 1 and 2 above.

Rows (A), (B), and (C) are comprised of alternate columns of full channel phase electrodes and signal dividing electrodes each establishing a corresponding signal processing cell. Thus, row (A) comprises a full channel input electrode 47 followed by signal division electrodes 52 and 53 followed by a full channel electrode 59. Similarly, electrode 59 is followed by signal division electrodes 64 and 65, which, in turn, are followed by full channel phase electrode 72. This alternation of full channel phase electrodes and signal division electrodes continues to the final full channel electrode 76. It should be noted that, for purposes of brevity, certain columns corresponding to numbers 72 – 74 have been omitted. Similarly, rows (B) and (C) are comprised of alternate full channel electrodes such as 48 and 49 followed by signal divisional electrodes such as 54, 55, 56, and 57. This alternation of electrodes continues in a similar fashion to that previously described in connection with row (A) until the row is completed and illustrated by full phase electrodes 77 and 78. As shown, a differential amplifier 79 has two input terminals, one connected to alternate columns of row (V), and the other connected to alternate columns of row (C).

As illustrated, alternate columns of the electrode array are connected to preceding electrodes by either a gate designated in G-1 or a gate designated in G-4. The various gates are numbered in accordance with the sequence in which they are clocked. When the input voltage in row V is transferred from the cell associated with electrode 46 to that associated with electrode 51 by means of gate G-1, a comparison voltage in row (A) is similarly transferred by gate G-1 and divided between electrodes 52 and 53. Likewise, a similar comparison between known voltage values occurs between rows (B) and (C).

The comparison between the charge associated with electrode 46 and electrode 49 is accomplished by means of differential amplifier 79. A similar comparison between the charge under alternate electrodes in channel (V) and that produced by the known voltages in row (C) is made at appropriate clocking intervals in accordance with the aforediscussed algorithm.

It will be observed, that a slightly different gating arrangement is used in row (C). That is, alternate phase electrodes, 62 and 74 have two inputs, one from each of the preceding signal division electrodes. The extra input is obtained by a gate indicated as G-5. Of course, this permits electrodes 62 and 74 to function as summation electrodes and add together the charges transferred by gates G-4 and G-5. Similarly, gates G-2 and G-3 interconnect rows (V) and (A), and (B) and (C), respectively.

Of course, the summation capability provided by gates G-2, G-3, and G-5 permits the additions indicated in the general algorithm diagram, FIG. 4 indicated in blocks 31, 32, 33, 34, and 35. As previously discussed, and indicated schematically at the bottom of FIG. 6, the various gates are normal clock generators 81, 83, and 89, which are controlled by conventional logic circuitry indicated generally at 82, 84, and 90. In this fashion, gate G-5 is not actuated until a "Yes" answer is obtained from one of the comparisons controlled by gate G-4 and in this fashion, the individual registers have their values switched corresponding to the appropriate horizontal channel previously discussed in connection with FIG. 4. Similarly, logic circuitry 84 does not permit coupling of gate G-2 until the first "No" answer is obtained after actuation of gate G-5.

Thus, it may be seen that the illustrated electrode arrangement provides the necessary charge transfers, charge divisions, and charge additions in the development of the algorithm of operation.

MODE OF OPERATION

Figure 7:
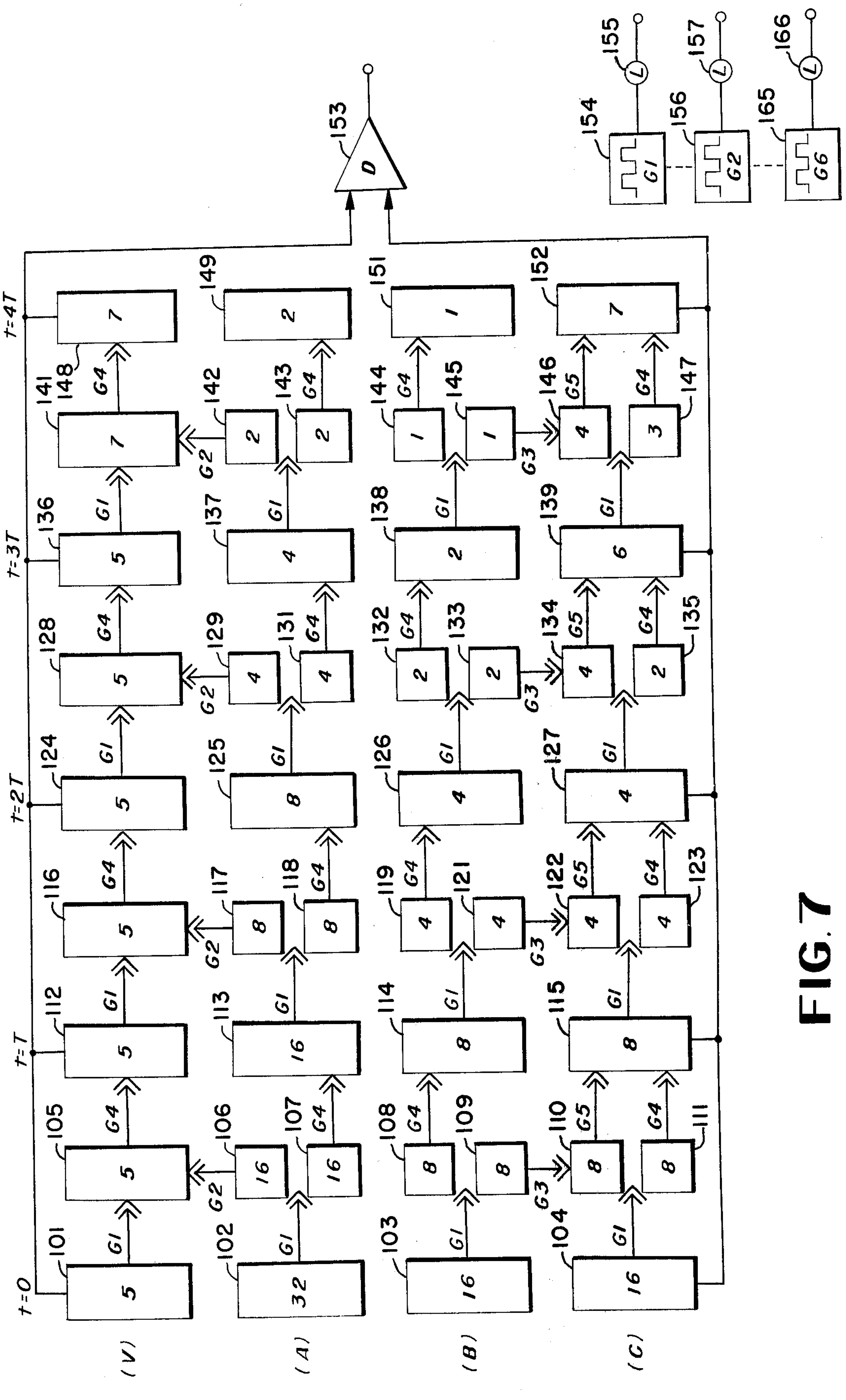
FIG. 7 is a diagramatic showing of the implementation of the invention for a five bit digital signal system and relative positioning of the electrode structure as would be employed in the example of FIG. 5.

Referring to FIG. 7 an exemplary electrode pattern corresponding to that shown in FIG. 6 is illustrated and the numbers shown in the individual electrode rectangles correspond to the charge divisions previously discussed in connection with FIG. 5. Thus, at time T = 0 the unknown or analog voltage 5 is impressed on electrode 101, reference voltage 32 is impressed on electrode 102 and comparison voltages 16 are impressed on electrodes 103 and 104. As previously explained, each of these electrode voltages causes a corresponding charge region to be stored in the silicon wafer beneath the electrodes. Differential amplifier 153 compares these voltages and produces a "No" answer as previously described.

Upon operation of opening of gate G-1, the analog voltage 5 is transferred to electrodes 105. At the same time, comparison voltage 32 is divided between electrodes 106 and 107 and reference voltage electrode 103 is divided between electrodes 108 and 109. Similarly, the comparison voltage on electrode 104 is divided between electrodes 110 and 111.

Figure 8:
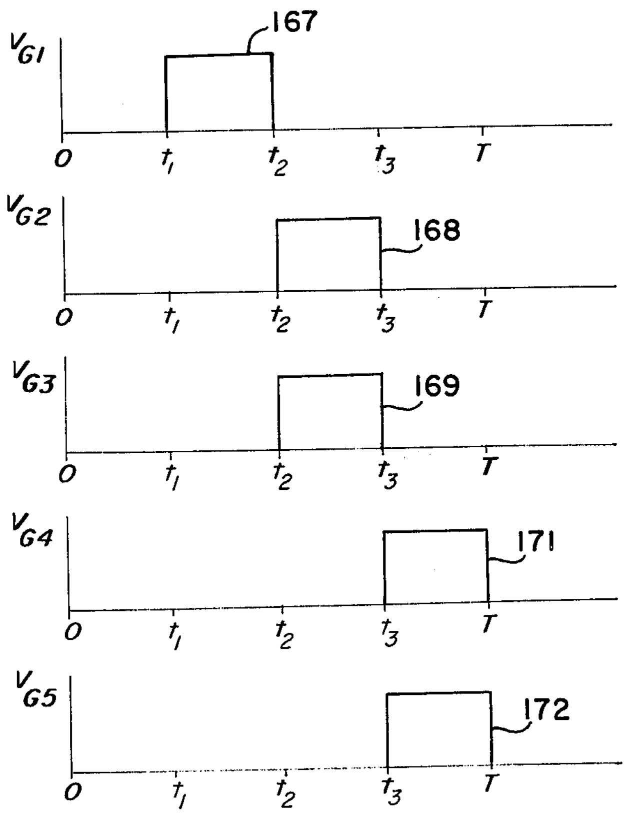
FIG. 8 is a waveform chart showing the timely energization of the gating pulses of the system of FIG. 7.

Referring to FIG. 8, this operation of gate G-1 is shown by square wave 167, corresponding to a timed duration indicated between $t_1$ and $t_2$. Next, as indicated by waveforms 168 and 169, gates G-2 and G-3 are enabled between time periods $t_2$ and $t_3$. However, because the first comparison was a "No" answer the associated logic circuit prevents these voltages from being applied.

Referring again to FIG. 7, it may be seen that the opening of gate G-4 effects the interrogative, "Is five equal to or greater than eight." Of course, this answer is "No" and as previously discussed, this "No" answer is fed to logic 166 to inhibit the clock providing the gate signal G-5 such that when (FIG. 8) clocks G-4 and G-5 produce waveforms 171 and 172, waveform 172 is not applied to the gating electrodes. Similarly, since no "Yes" answer has occurred, logic 157 inhibits gate G-2 in a similar fashion.

However, in the next time interval extending from $t^3$ to T, gate pulse 171 is applied to gate G-4 and the analog charge is transferred from electrodes 116 to 124 and the comparison charge is transferred from electrode 118 to 125 and the (B) channel reference charge is transferred from electrode 114 to electrode 126 and the (C) channel reference charge is transferred from electrode 123 to electrode 127. Differential amplifier 153 again compares "Is five equal to or greater than four" and obtains a "Yes" answer. As previously described, this "Yes" answer will permit logic circuitry to activate gate G-3 in its appropriate time sequence.

On the next timed sequence, operation of gate G-1 transfers the unknown voltage in the (V) channel, electrode 124 to 128. Likewise, the charge corresponding to 8 on electrode 125 is divided between electrodes 129 and 131 placing a value of four on each electrode. Similarly, the charge four under electrode 126 is transferred and divided between electrodes 132 and 133. A similar division occurs with the charge under electrode 127 which is divided between electrodes 134 and 135 placing a value of two on each electrode.

Although the first "Yes" answer has occurred, a succeeding "No" answer has not occurred, and gate G-2 is prevented from transferring charge from 129 to electrode 128. However, gate G-3 is enabled and the charge under electrode 133 is transferred to 134 placing a charge equivalency of four under that particular electrode.

During the next time interval, gate G-4 operates to transfer the charge under electrode 128 to electrode 136 and the charge between electrode 131 to electrode 137. The charge corresponding to two under electrode 132 is transferred to electrode 138 and the charge corresponding to two under electrode 135 is transferred to electrode 139. Since the first "Yes" answer has occurred, gate G-5 is also activated and it transfers the charge corresponding to four under electrode 134 to electrode 139 placing a charge under electrode 139 corresponding to six.

Thus, differential amplifier 153 compares at $t$ = 3T, the charge under electrode 136 with a charge under electrode 139. Such that the answer to the interrogative "Is five equal to or greater than six" produces a "No" answer. This "No" answer enables a logic circuit 157 to apply the gating output of gate clock 156, the G-2 gate, to be enabled during the next clocking sequence.

Thus, during the clocking interval G-1 the charge corresponding to the analog voltage five is transferred from beneath electrode 136 to the potential well beneath electrode 141 and the charge under electrode 137 is divided between electrodes 142 and 143 placing a value thereon corresponding to two. Also, the charge beneath electrode 138 is divided beneath electrodes 144 and 145 and, similarly, the charge beneath electrode 139 is divided between electrodes 146 and 147.

During the clocking interval $t_2$ to $t_3$ both gates G-2 and G-3 are enabled thereby transferring the charge corresponding to two beneath electrode 142 to electrode 141 where it is added to the analog voltage five to produce an equivalency of seven beneath electrode 141. Likewise, gate G-3 moves the charge beneath electrode 145 to the space beneath the electrode 146 where it is added to the three, placed there by gate G-1, to produce a value of four.

During the next clocking interval, both gates G-4 and G-5 are enabled placing the value seven in the (V) channel corresponding to electrode 148 the value two is placed in the (A) channel by the transfer of the charge beneath electrode 143 to electrode 149. The value one is placed in the (V) channel of the charge beneath electrode 144 to electrode 151 and the value seven is placed in the "C" channel by the simultaneous transfer of the four beneath electrode 146 and a three beneath electrode 147 to electrode 152.

The charges beneath electrode 148 and 152 are now compared by differential amplifier 153 to produce the final "Yes" digit in the digital answer.

Although the example described is for a simple five digit A/D converter, it should be obvious that the same algorithm and design standards may be applied with equal facility to larger digital word groupings.

The aforegoing description taken together with the appended claims constitute a disclosure such as to enable a person skilled in solid state circuit design and digital programming arts to have the benefit of teachings contained therein to make and use the invention. Further, the structure herein described meets the aforestated objects of invention, and generally constitutes a meritorious advance in the art, unobvious to such persons not having the benefit of these teachings.

What is claimed:

1. An analog to digital converter employing a charge transfer matrix comprising:

a semiconductor substrata for storage of charge regions representing the analog signal and other comparison signals;

a plurality of electrodes cooperatively positioned in four linear channels of 2N − 1 cells, where N is the number of digital bits required in the digital answer, individual cells being defined by the physical extend of the associated electrode and being numbered from one commencing with the input cell;

a first one of said electrode channels includes electrodes shaped to provide only full charge transfer cells to provide a channel for storage and transfer of the analog signal and for addition of signal thereto;

a second one of said electrode channels arranged adjacent said first electrode channel including odd-numbered full charge transfer cells and alternate even-numbered charge division cells whereby the initial charge placed therein is reduced to successively approximate the charge in said first channel upon sequented charge transfer;

a third one of said four electrode channels positioned on the opposite side of said second electrode channel from said first electrode channel and including alternate, oddnumbered full charge transfer cells and even-numbered charge division cells for establishing a comparison voltage channel;

a fourth one of said four electrode channels positioned on the opposite side of said third electrode channel from said second electrode channel and including alternate odd-numbered full charge transfer cells and even-numbered charge division cells for cooperation with said third one of said four electrode channels;

a first series of charge transfer gates extending between and for moving charges between odd and even numbered cells in each channel;

a second series of charge transfer gates arranged to extend between one of each pair of said charge division cells in said second one of said electrode channels and an adjacent, even-numbered full charge transfer cell in said first one of said electrode channels for charge transfer therebetween whereby a charge from said charge division cells may be added to the charge within said analog signal channel;

a third series of charge transfer gates arranged to extend between one of each pair of said even-numbered charge division cells in said third electrode channel and one of each pair of even-numbered charge division cells in said fourth electrode channel for charge transfer therebetween for charge transfer and addition therebetween;

a fourth series of charge transfer gates arranged to extend between each of said even-numbered and said odd-numbered cells in said first electrode channel and between each of the other even-numbered charge division cells in said second, third, and fourth electrode channels and the odd-numbered cells therein for charge transfer therebetween;

a fifth series of charge transfer gates arranged to extend between said one of each pair of said even-numbered charge division cells and said odd-numbered full charge transfer cells in said third electrode channel for charge transfer therebetween;

logic controlled clocking circuit means connected to each of the aforerecited charge transfer gates for effecting a timely migration of electrical charges between the associated cells in dependence on the charge potential therebetween; and differential amplifier means connected between the odd-numbered full charge transfer cells in said first electrode channel and the odd-numbered full charge transfer cells in said fourth electrode channel for producing an output when a predetermined difference exists therebetween whereby a digital word output results in dependence upon the particular charge migrations established by the said first through fifth series of charge transfer gates and logic controlled clocking circuit means as the charge in the fourth electrode channel is processed to approximate the analog signal input of the first electrode channel.

* * * * *